United States Patent
Lee et al.

(10) Patent No.: US 7,647,546 B2
(45) Date of Patent: Jan. 12, 2010

(54) APPARATUS AND METHOD FOR DECODING REED-SOLOMON SYMBOLS

(75) Inventors: Kyung-Eun Lee, Suwon-si (KR); Jun-Won Ko, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 490 days.

(21) Appl. No.: 11/313,729

(22) Filed: Dec. 22, 2005

(65) Prior Publication Data

US 2006/0150066 A1 Jul. 6, 2006

(30) Foreign Application Priority Data

Dec. 22, 2004 (KR) .................. 10-2004-0110733

(51) Int. Cl.
*H03M 13/00* (2006.01)
(52) U.S. Cl. .................. 714/784; 714/758; 714/799; 375/288
(58) Field of Classification Search .......... 714/758, 714/784, 799; 375/288
See application file for complete search history.

(56) References Cited

U.S. PATENT DOCUMENTS

| | | | |
|---|---|---|---|
| 5,373,511 A | 12/1994 | Veksler | 714/755 |
| 5,712,861 A | 1/1998 | Inoue et al. | 714/752 |
| 6,341,362 B1 | 1/2002 | Golnabi | 714/784 |
| 6,947,487 B2 * | 9/2005 | Choi et al. | 375/240.25 |
| 7,068,326 B2 * | 6/2006 | Choi et al. | 348/614 |
| 7,073,118 B2 * | 7/2006 | Greenberg et al. | 714/796 |
| 7,076,725 B2 * | 7/2006 | Ikeda et al. | 714/789 |

\* cited by examiner

*Primary Examiner*—Esaw T Abraham
(74) *Attorney, Agent, or Firm*—Roylance, Abrams, Berdo & Goodman, L.L.P.

(57) ABSTRACT

A digital multimedia broadcasting (DMB) reception apparatus receives DMB service in a mobile communication system. In the DMB reception apparatus, a Reed-Solomon (R-S) decoder receives a coded broadcast signal and outputs an error symbol with a transport error indicator bit, if all data bits in the symbol are '0'. A moving picture experts group (MPEG) decoder discards the error symbol.

9 Claims, 6 Drawing Sheets

US 7,647,546 B2

APPARATUS AND METHOD FOR DECODING REED-SOLOMON SYMBOLS

PRIORITY

This application claims the benefit under 35 U.S.C. § 119(a) of Korean Patent Application entitled "Apparatus and Method for Decoding Reed-Solomon Symbols" filed in the Korean Intellectual Property Office on Dec. 22, 2004 and assigned Serial No. 2004-110733, the entire disclosure of which is hereby incorporated by reference.

BACKGROUND OF THE INVENTION

1. Field of the Invention

The present invention relates generally to an apparatus and method for decoding coded symbols. More particularly, the present invention relates to an apparatus and method for decoding symbols coded by Reed-Solomon (R-S) coding.

2. Description of the Related Art

In a process of storing or transmitting data, various coding methods are used to secure data stability. Generally, a mobile communication system uses a typical coding method such as a convolutional coding method, turbo coding method, or R-S coding method used to safely transmit data. The mobile communication system uses either one of the coding methods separately, or two or more of the coding methods together. If symbols stored in a recording medium after being coded by the coding methods are read and transmitted, a receiver must decode the coded data in order to acquire the original data or information. Therefore, a communication system or a data reading apparatus requires decoding apparatuses.

In the following description of a decoding process, it will be assumed for convenience purposes that when a communication system transmits data, a receiver acquires the original data or information, from received coded symbols.

When an error exists in received symbols, a decoding apparatus detects the error and performs an iterative decoding process on the received symbols, thereby acquiring correct data. The iterative decoding process is performed in a convolutional decoder or a turbo decoder in a receiver when coding is performed using a convolutional encoder or a turbo encoder in a transmitter. When data is coded by the R-S coding method, an R-S decoder in a receiver performs the iterative decoding process only for a particular case. A brief description of the R-S decoder will now be described.

The R-S decoder, which is a block code decoder, performs error correction on a block-by-block basis. In particular, the R-S decoder is usefully used in a satellite Digital Multimedia Broadcasting (DMB) receiver for mobile reception. An R-S encoder uses R-S codes as outer codes of concatenated codes together with convolutional codes in a satellite DMB system.

In the satellite DMB system, if a transmitter transmits over a broadcast channel, data of a total of 204 bytes, the sum of actual broadcast data (hereinafter referred to as "effective data") of 188 bytes and a parity of 16 bytes generated using an R-S encoder, a receiver detects the number of errors and positions of the errors using a 16-byte parity and corrects the errors.

Also, if the transmitter transmits over a pilot channel, data of a total of 96 bytes, the sum of 80-byte effective data and a 16-byte parity generated using the R-S encoder, the receiver detects the number of errors and positions using the 16-byte parity and corrects the errors.

A brief description will now be made of a process of receiving satellite DMB service.

FIG. 1 is a block diagram illustrating a structure of a conventional satellite DMB reception apparatus. With reference to FIG. 1, a brief description will now be made of a conventional method for receiving satellite DMB service.

Referring to FIG. 1, a satellite broadcast signal received from a DMB satellite or a gap filler, which is a terrestrial repeater, is input to a bit deinterleaver 110. The bit deinterleaver 110 deinterleaves the received satellite broadcast signal bit by bit in order to convert a burst error into scattered errors, and outputs the deinterleaved satellite broadcast signal to a Viterbi decoder 120.

The Viterbi decoder 120 error-corrects the deinterleaved satellite broadcast signal, and outputs the error-corrected satellite broadcast signal to a byte deinterleaver 130. The byte deinterleaver 130 deinterleaves the satellite broadcast signal output from the Viterbi decoder 120 on a byte-by-byte basis. The byte deinterleaver 130 converts a burst error into scattered errors on a byte-by-byte basis in order to correct a possible burst error occurring when the Viterbi decoder 120 fails in the error correction. The byte deinterleaver 130 outputs the deinterleaved satellite broadcast signal to an R-S decoder 140.

The R-S decoder 140 error-corrects the deinterleaved satellite broadcast signal using parity data, and outputs the error-corrected satellite broadcast signal to a conditional access system (CAS) 150. The CAS 150 performs a predetermined reception authentication process on a CAS channel signal received from the R-S decoder 140. If the satellite broadcast signal passes the reception authentication in the CAS 150, the satellite broadcast signal is provided to a demultiplexer 170 via a dual port read access memory (DPRAM) 160. The demultiplexer 170 demultiplexes the error-corrected satellite broadcast signal received from the R-S decoder 140 into audio data and video data, and outputs the audio data and video data to an audio buffer 180 and video buffer 190, respectively. The audio data buffered in the audio buffer 180 is played back through an audio decoder (not shown), and the video data buffered in the video buffer 190 is played back through a video decoder (not shown).

The demultiplexer 170, audio buffer 180, video buffer 190, audio decoder, and video decoder constitute a Moving Picture Experts Group (MPEG) decoder.

When an error of 8 bytes or greater exists in input data, the R-S decoder 140 cannot correct the error. If the R-S decoder 140 fails in the error correction due to the oversized error, it discards the input data. In addition, the R-S decoder 140 sets a transport error indicator 200 in a header defined in an MPEG-2 transport stream (TS) shown in FIG. 2, to '1', and delivers the MPEG-2 TS to the CAS 150 of FIG. 1. Then the CAS 150 performs the reception authentication process on a CAS channel signal received from the R-S decoder 140. If the satellite broadcast signal passes the reception authentication in the CAS 150, the satellite broadcast signal is provided to the demultiplexer 170 via the DPRAM 160. Then the demultiplexer 170 discards the error correction-failed data.

A process of generating parity bytes in an R-S encoder will now be described with reference to FIG. 3.

Referring to FIG. 3, effective data input to an nth adder 325 is provided to multipliers 311 through 315 where the effective data is multiplied by their own unique constants $g_0$ through $g_{n-k-1}$. Specifically, a first multiplier 311 multiplies the input effective data by a constant $g_0$, and provides output to a first shift register 301. The first shift register 301 shifts the output of the first multiplier 311 and provides output to a first adder 321. A second multiplier 313 multiplies the input effective data by a constant $g_1$, and provides output to the first adder 321. The first adder 321 adds the output of the second multiplier 313 to the output of the first shift register 301, and provides output to a second shift register 303. Similarly, an (n−k−1)th multiplier 315 multiplies the input effective data by a constant $g_{n-k-1}$, and provides output to an (n−1)th adder 323. The (n−1)th adder 323 adds the output of the (n−k−1)th multiplier 315 to the output of an (n−k)th shift register (not shown), and provides output to an nth shift register 305. The nth shift register 305 shifts the output of the (n−1)th adder 323, and provides output to the nth adder 325. The nth adder 325 adds the output of the nth shift register 305 to an input $x^{n-k}m(x)$, thereby generating parity.

That is, upon receiving the effective data, the R-S encoder multiplies the input effective data by constants go through $g_{n-k-1}$ in multipliers while shifting the multiplied values using shift registers, thereby generating parity.

If all of the effective data bits are '0', the R-S encoder generates and transmits all-zero parity along with the effective data.

In addition, if a receiver is located in a blanket area such as a tunnel, the R-S decoder may receive all-zero input data. In this instance, if the R-S decoder in the receiver performs decoding using the parity information, a determination is made that an error does not exist. As a result, an application chip (AP), that is, the demultiplexer 170, regards the received all-zero data as an error-free packet, even though the received all-zero data is a meaningless error packet. Therefore, the AP parses the received data, determining that the received data is a packet association table (PAT) with a packet identifier (PID) 210 of FIG. 2 being set to '0' (PID=0). Such an error indication failure, that is, a failure to distinguish between an error packet and an error-free packet, may cause mis-operation of a satellite DMB reception apparatus.

Accordingly, there is a need for an improved apparatus and method for detecting and correcting an error in an R-S decoder.

SUMMARY OF THE INVENTION

An aspect of embodiments of the present invention is to address at least the above problems and/or disadvantages and to provide at least the advantages described below. Accordingly, an aspect of embodiments of the present invention is to provide an apparatus and method for detecting and correcting an error in an R-S decoder.

It is another object of the present invention to provide an apparatus and method for correctly detecting an error occurred in the data received in a blanket area.

According to one aspect of an exemplary embodiment of the present invention, there is provided a digital multimedia broadcasting (DMB) reception apparatus for receiving DMB service in a mobile communication system. The apparatus includes a Reed-Solomon (R-S) decoder for receiving a coded broadcast signal, and outputting an error symbol with a transport error indicator bit, if all data bits in the symbol are '0'; and a moving picture experts group (MPEG) decoder for discarding the error symbol.

According to another aspect of an exemplary embodiment the present invention, there is provided a decoding apparatus for decoding a coded symbol in a mobile communication system. The apparatus includes an input buffer for storing input data on a symbol-by-symbol basis. A zero detector outputs an error generated signal if all data bits in a symbol output from the input buffer are '0'. A transport error indicator bit generator generates a transport error indicator bit, according to the error generated signal output from the zero detector. An output symbol generator generates an output symbol including the generated transport error indicator bit.

According to a further aspect of an exemplary embodiment of the present invention, there is provided a method for receiving digital multimedia broadcasting (DMB) service in a mobile communication system. The method includes receiving a broadcast signal, and outputting an error symbol including a transport error indicator bit if all data bits in the symbol are '0'; and discarding the error symbol.

According to still another aspect of an exemplary embodiment of the present invention, there is provided a method for decoding a coded symbol in a mobile communication system. The method includes storing input data on a symbol-by-symbol basis An error generated signal is output, if all data bits in an input symbol are '0'. A transport error indicator bit is generated according to the error generated signal. An output symbol including the generated transport error indicator bit is generated.

Other objects, advantages, and salient features of the invention will become apparent to those skilled in the art from the following detailed description, which taken in conjunction with the annexed drawings, discloses exemplary embodiments of the invention.

BRIEF DESCRIPTION OF THE DRAWINGS

The above and other objects, features and advantages of certain exemplary embodiments of the present invention will be more apparent from the following description taken in conjunction with the accompanying drawings in which.

DETAILED DESCRIPTION OF EXEMPLARY EMBODIMENTS

The matters defined in the description such as a detailed construction and elements are provided to assist in a comprehensive understanding of the embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The present invention provides an apparatus and method for analyzing all signals input to an R-S decoder. If a determination is made that all data bits in one 204-byte symbol are zero, the symbol is detected as an error symbol.

Figure 4:
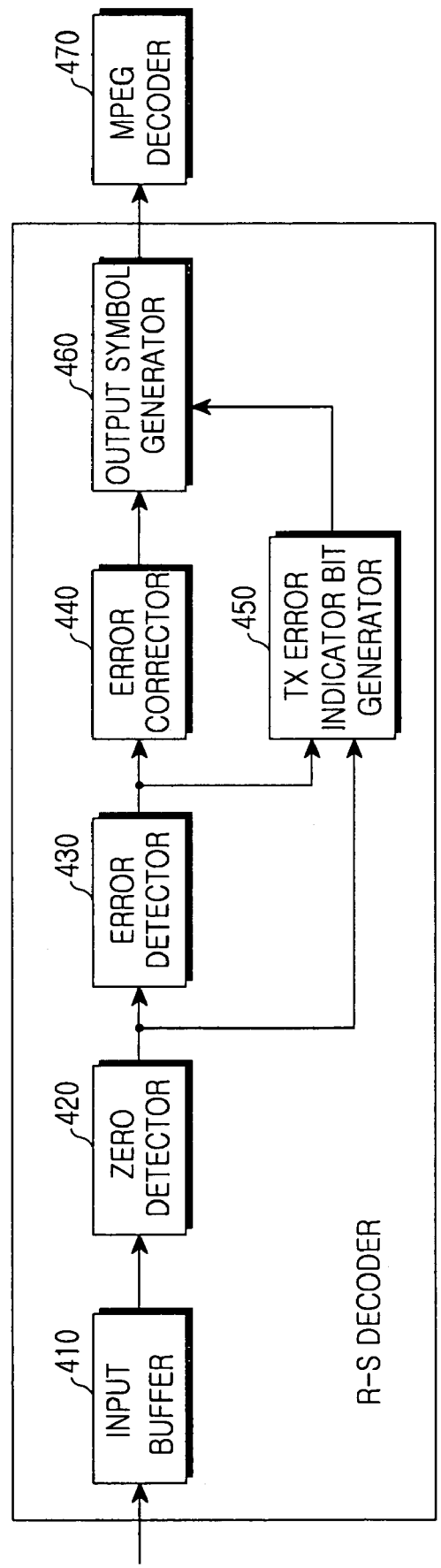
FIG. 4 is a block diagram illustrating an internal structure of a R-S decoder according to an exemplary embodiment of the present invention.

With reference to FIG. 4, a description will now be made of an internal structure of the R-S decoder according to an exemplary embodiment of the present invention.

Referring to FIG. 4, an input buffer 410 buffers input data on a symbol-by-symbol basis, and provides output to a zero detector 420. The zero detector 420 determines whether all data bits in the symbol output from the input buffer 420 are '0', and provides the input data to either an error detector 430 or a transport error indicator bit generator 450 according to the determination result. If all the data bits are '0', indicating that the corresponding symbol is error data, the zero detector 420 outputs the input data to the transport error indicator bit generator 450. However, if all the data bits are not '0', the input data is received by the error detector 430. The error detector 430 detects errors and positions in the symbol output from the zero detector 420. The error detector 430 then provides output to either an error corrector 440 or the transport error indicator bit generator 450, depending on whether a size of the detected error exceeds a threshold size (or error-correctable size). That is, if a size of the detected error exceeds the threshold size, the error detector 430 provides output to the transport error indicator bit generator 450. Herein, the threshold size indicates 8 bytes, as described above. However, if a size of the detected error is smaller than or equal to the threshold size, the error detector 430 outputs the input symbol to the error corrector 440. The error detector 440 corrects the detected error in the symbol output from the error detector 430.

Figure 1:
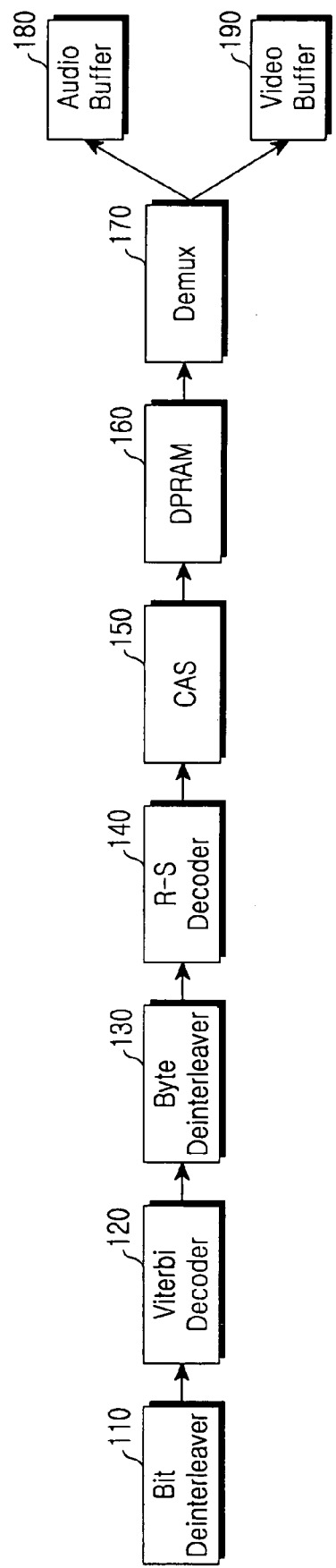
FIG. 1 is a block diagram illustrating a structure of a conventional satellite DMB reception apparatus.
Figure 2:
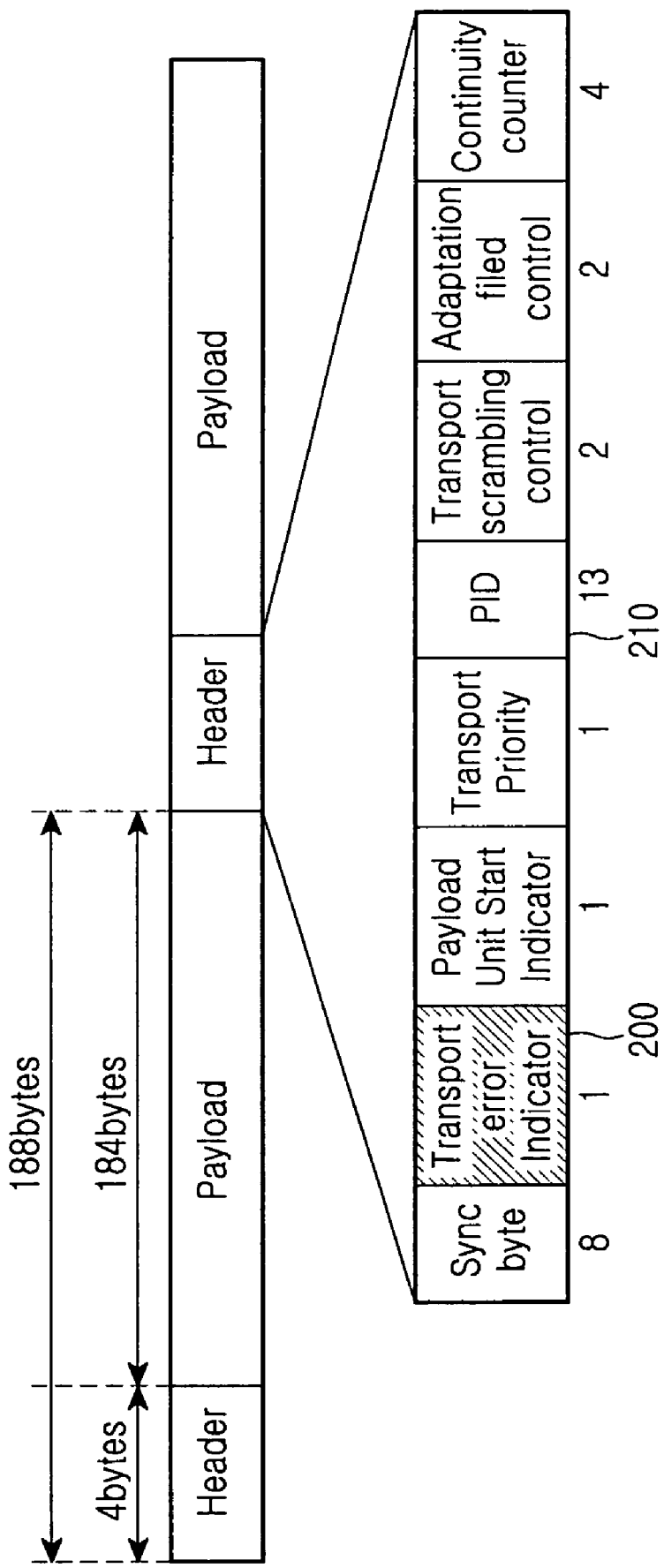
FIG. 2 is a diagram illustrating a format of a MPEG-2 TS.
Figure 3:
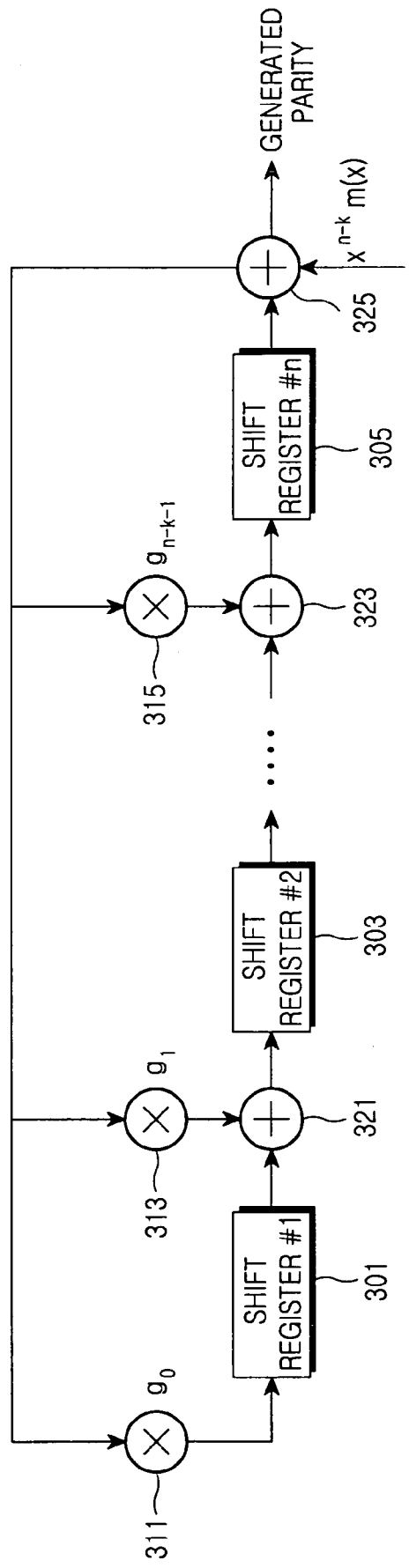
FIG. 3 is a diagram illustrating a structure of a R-S encoder.

The transport error indicator bit generator 450 generates a transport error indicator bit according to one control signal received when the zero detector 420 determines that all data bits in the symbol are '0', and another control signal received when the error detector 430 detects an error, which is a size that exceeds the threshold size. Generating the transport error indicator bit by the transport error indicator bit generator 450 is equivalent to setting the transport error indicator 200 in the MPEG-2 TS header shown in FIG. 2 to '1'. An output symbol generator 460 outputs the error-corrected symbol received from the error corrector 440. Alternatively, the output symbol generator 460 inserts the transport error indicator bit output from the transport error indicator bit generator 450 into an output symbol, and provides the output symbol to an MPEG decoder 470. The MPEG decoder 470 includes the demultiplexer 170 shown in FIG. 1 and the demultiplexer 170 succeeding stages. The CAS 150 and the DPRAM 160 shown in FIG. 1 are omitted from FIG. 4, for clarity and conciseness.

If an error-corrected symbol is received from the output symbol generator 460, the MPEG decoder 470 decodes the received error-corrected symbol, determining that the received symbol is a normal symbol. However, if a symbol with a transport error indicator bit being set to '1' is received from the output symbol generator 460, the MPEG decoder 470 discards the received symbol, determining that the received symbols is an error symbol.

Figure 5:
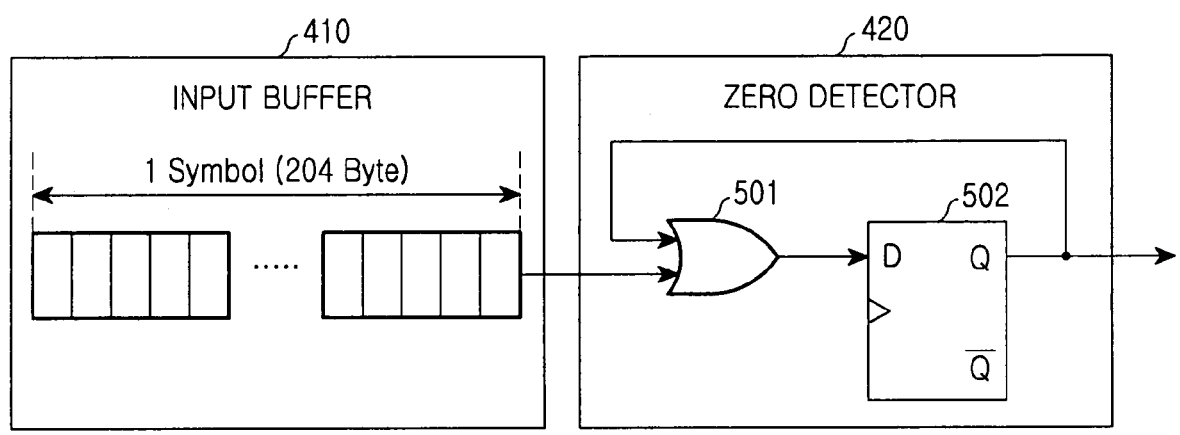
FIG. 5 is a diagram illustrating an exemplary internal structure of the input buffer and the zero detector shown in FIG. 4 according to an exemplary embodiment of the present invention.

FIG. 5 is a diagram illustrating an exemplary internal structure of the input buffer and the zero detector shown in FIG. 4, according to an exemplary embodiment of the present invention.

Referring to FIG. 5, symbols stored in the input buffer 410 are sequentially input to one input end of an OR gate 501 in a zero detector 420 on a first-in first-out (FIFO) basis. Another input end of the OR gate 501 is connected to an output of a D flip-flop 502. An output of the OR gate 501 is input to the D flip-flop 502. The D flip-flop 502 maintains an output value of the OR gate 501. The output of the D flip-flop 502, as described above, is fed back to the OR gate 501. If a final output value obtained by passing one symbol through the zero detector 420 is '0', all data bits in one symbol are '0', so performing error detection and correcting the one symbol is not possible. Therefore, the error detector 430 is disabled and the transport error indicator bit generator 450 sets the transport error indicator 200 in the MPEG-2 TS header to '1'. The output symbol generator 460 inserts the transport error indicator bit into an output symbol, and transmits the output symbol to the MPEG decoder 470. If a final output value obtained by passing all data bits in the symbol through the zero detector 420 is '1', the R-S decoder operates in a normal error detection mode, in which the R-S decoder detects positions of errors and corrects the detected errors without exceeding error correction capability.

Figure 6:
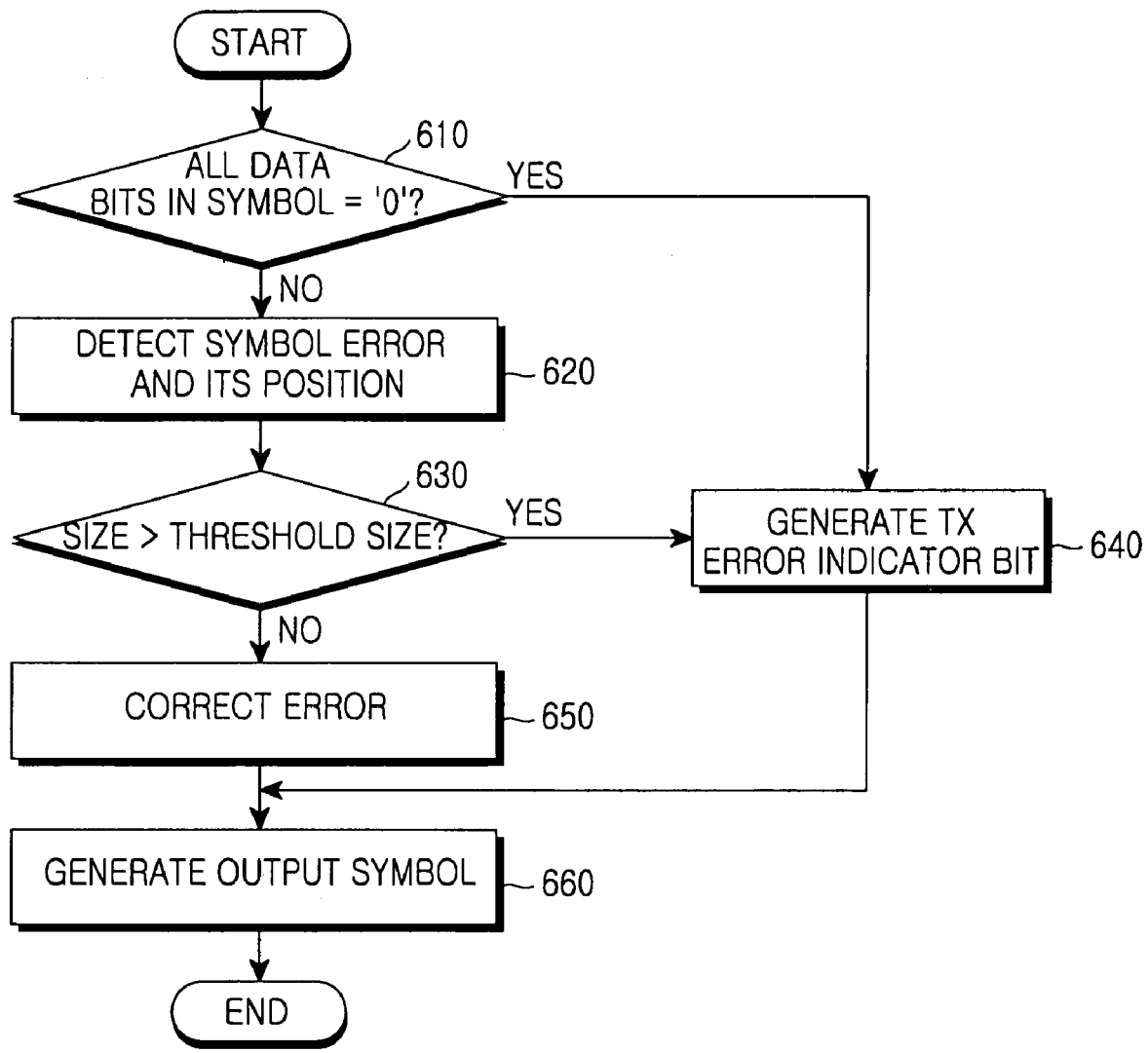
FIG. 6 is a flowchart illustrating an error detection and correction process in an R-S decoder according to an exemplary embodiment of the present invention.

FIG. 6 is a flowchart illustrating an error detection and correction process in the R-S decoder according to an exemplary embodiment of the present invention.

Referring to FIG. 6, a zero detector 420 in the R-S decoder determines in step 610 whether all data bits in one input symbol are '0'. The zero detector 420 can determine whether all data bits in one input symbol are '0', by determining if a final output value of the D flip-flop 502 is '0'. If a determination is made in step 610 that all data bits in one input symbol are '0', indicating that a receiver moves to a blanket area such as a tunnel in, for example, a satellite DMB system, the receiver receives an all-zero signal. In this instance, a transport error indicator bit generator 450 in the R-S decoder sets the transport error indicator 200 in the MPEG-2 TS header to '1' in step 640, determining that all data bits in the received symbol are '0'. In step 660, the output symbol generator 460 generates an output symbol with the transport error indicator bit being set to '1'. Then a demultiplexer 170 shown in FIG. 1 discards a received packet, determining that the received packet is an error packet.

However, if a determination is made in step 610 that all data bits in the symbol are not '0', the error detector 430 in the R-S decoder detects an error and its position in the symbol in step 620. The error detector 430 determines in step 630 whether a size of the detected error exceeds a threshold size (or error-correctable size). Herein, the threshold size indicates 8 bytes.

If it is determined in step 630 that the size of the error exceeds the threshold size, the transport error indicator bit generator 450 sets the transport error indicator 200 in the MPEG-2 TS header to '1' in step 640, and then proceeds to step 660. Then an MPEG decoder 470 discards the received symbol, determining that the received symbol is an error symbol.

However, if it is determined in step 630 that the size of the error is smaller than or equal to the threshold size, the error corrector 440 corrects the error in step 650, and the output symbol generator 460 generates a normal output symbol in step 660. Then the MPEG decoder 470 uses the received symbol in decoding the corresponding packet, determining that the received symbol is a normal symbol.

From the foregoing description, the R-S decoder according to an exemplary embodiment of the present invention can detect an error when all data bits in a symbol received in a blanket area are '0', making it possible to correctly detect an error.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A digital multimedia broadcasting (DMB) reception apparatus for receiving DMB service in a mobile communication system, the apparatus comprising:

a Reed-Solomon (R-S) decoder for receiving a coded broadcast signal having a symbol and outputting an error symbol with a transport error indicator bit if all data bits in the symbol are '0'; and a moving picture experts group (MPEG) decoder for discarding the error symbol, wherein the R-S decoder comprises:

an input buffer for storing input data on a symbol-by-symbol basis;

a zero detector for outputting an error generated signal if all data bits in a symbol output from the input buffer are '0';

a transport error indicator bit generator for generating the transport error indicator bit according to the error generated signal output from the zero detector;

an output symbol generator for generating an output symbol including the generated transport error indicator bit; and an error detector for detecting an error and a position of the error in a symbol output from the zero detector, if all data bits in the symbol output from the input buffer are not '0', and determining whether to output an error generated signal or error correction signal, depending on whether a size of the detected error exceeds a threshold size.

2. The DMB reception apparatus of claim 1, wherein the zero detector comprises:

an OR gate; and a flip-flop connected to a rear end of the OR gate;

wherein the flip-flop maintains an output of the OR gate and the OR gate provides an OR logic function to the output symbol from the input buffer and an output of the flip flop.

3. The DMB reception apparatus of claim 1, wherein the error detector outputs the error generated signal to the transport error indicator bit generator, if the size of the detected error exceeds the threshold size.

4. The DMB reception apparatus of claim 1, wherein the error detector outputs the error correction signal, if the size of the detected error is smaller than or equal to the threshold size.

5. The DMB reception apparatus of claim 1, further comprising an error corrector for correcting an error using an error correction signal received from the error detector.

6. A method for receiving digital multimedia broadcasting (DMB) service in a mobile communication system, the method comprising the steps of:

receiving a broadcast signal having a symbol;

outputting an error symbol including a transport error indicator bit if all data bits in the symbol are '0'; and discarding the error symbol, wherein the step of outputting the error symbol comprises the steps of:

storing input data on a symbol-by-symbol basis;

outputting an error generated signal if all data bits in an input symbol are '0';

generating a transport error indicator bit according to the error generated signal;

generating an output symbol comprising the generated transport error indicator bit; and detecting an error and a position of the error in the symbol, if all data bits in the input symbol are not '0', and determining whether to output an error generated signal or error correction signal, depending on whether a size of the detected error exceeds a threshold size.

7. The method of claim 6, further comprising the step of outputting the error generated signal, if the size of the detected error exceeds the threshold size.

8. The method of claim 6, further comprising the step of outputting the error correction signal, if the size of the detected error is smaller than or equal to the threshold size.

9. The method of claim 6, further comprising the step of correcting an error using a received error correction signal.

* * * * *

UNITED STATES PATENT AND TRADEMARK OFFICE
CERTIFICATE OF CORRECTION

PATENT NO. : 7,647,546 B2
APPLICATION NO. : 11/313729
DATED : January 12, 2010
INVENTOR(S) : Lee et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 723 days.

Signed and Sealed this

Sixteenth Day of November, 2010

David J. Kappos
*Director of the United States Patent and Trademark Office*